LOW RESISTIVITY SEMICONDUCTOR UNDERPASS CONNECTOR AND FABRICATION METHOD THEREFOR

Filed March 31, 1966

INVENTORS
BENJAMIN AGUSTA
MARTIN S. HESS

BY Harry M Weiss
ATTORNEY

United States Patent Office 3,443,176

Patented May 6, 1969

3,443,176
LOW RESISTIVITY SEMICONDUCTOR UNDERPASS CONNECTOR AND FABRICATION METHOD THEREFOR

Benjamin Agusta and Martin S. Hess, Poughkeepsie, N.Y., assignors to International Business Machines Corporation, Armonk, N.Y., a corporation of New York Filed Mar. 31, 1966, Ser. No. 539,123
Int. Cl. H01l 11/10, 15/00
U.S. Cl. 317—235 8 Claims

ABSTRACT OF THE DISCLOSURE

A low resistivity semiconductor underpass connector for integrated semiconductor circuits.

In an integrated circuit structure having a semiconductor substrate of a first type conductivity carrying an epitaxial layer of opposite type conductivity, a buried low resistivity region of said opposite type conductivity located in the surface portion of said substrate abuts a diffused low resistivity central region of said first type conductivity extending from the upper surface of said epitaxial layer to the buried low resistivity region. A diffused outer isolation region of said first type conductivity in said epitaxial layer is spaced from and surrounds said central region, enclosing between said central region and said outer isolation region a portion of said epitaxial layer which abuts the periphery of said buried region to form an inner isolation region around said central region. The isolated central region is the underpass connector to which a pair of spaced, metal electrical contacts are connected.

The semiconductor connector is formed by the same diffusion steps utilized in the formation of the integrated circuits, the buried region being created by the diffusion operation used in simultaneously forming buried layers for active devices in the integrated circuit, and the central region and outer isolation being created by the diffusion operation used in forming the isolation for the active and passive devices.

This invention is directed generally to low resistivity, semiconductor, underpass connectors including fabrication methods therefor and, more particularly, to an isolated low resistivity, semiconductor, underpass connector adaptable for incorporation into integrated semiconductor structures to interconnect semiconductor devices located therein and to permit a plurality of connectors to be disposed over a dielectrically encapsulated surface portion located on the surface of the semiconductor underpass connector between spaced metal contacts electrically connected to the connector.

Recent trends in the semiconductor art have been in the direction of miniaturization of semiconductor device structures to achieve higher operating speeds, lower cost of fabrication, and greater component reliability. Some of these miniature semiconductor devices are integrated by fabricating the devices in a single substrate of the same material as the semiconductor devices. Other integrated fabrication techniques form a number of integrated semiconductor devices on a support structure or substrate of any desired material. These fabrication techniques are being extensively developed in order to permit the utilization of semiconductor device components into large and complex electronic equipment, such as computers for higher speed operation. However, in order to reduce the expense in making an integrated semiconductor structure, it is necessary to devise improved low resistance underpass connectors for interconnecting active devices (i.e. transistors, diodes, etc.) and still permit connectors to cross over the underpass region for electrical connection to other portions of a very densely populated integrated structure.

In fabricating integrated structures, a significant savings in cost is realized if all the connectors or lands that are formed on an insulating layer disposed over the surface of the integrated structure are in one plane. This is an extremely difficult goal to achieve when working with very densely populated integrated structures employing large numbers of active devices and passive devices (i.e. resistors, capacitors, etc.). Consequently, in order to prevent the use of multiple layers of conductive lands separated by insulating layers, it is necessary to provide low resistivity underpass connectors in the integrated structure which connect up devices in the integrated structure and also permit the overpass of a multiplicity of connectors above the underpass region.

In the past, various underpass schemes were proposed which were formed by using either a base or emitter diffused region formed in a discrete area of the integrated semiconductor structure so as to provide an underpass between devices when a pair of spaced contacts were connected thereto. One problem associated with such a method of forming an underpass structure is that the conductivity of the underpass region and, hence, its resistivity was dependent on the conductivity of the base or emitter diffusion that was used to form the devices in the integrated semiconductor structure. Hence, changes in the conductivity of the diffused base or emitter diffusions resulted in resistivity changes in the connector. Accordingly, in the fabrication of an integrated semiconductor structure it is desirable to form a low resistivity connector which can be made without extra process steps and yet be independently formed with respect to the formation of the active or passive devices in the integrated semiconductor structure. In addition, it is desirable to form a low resistivity underpass connector which will have a high figure of merit that is defined as the reciprocal of the resistance times the capacitance. Therefore, by having a connector with a very low resistance and a very low capacitance a high figure of merit is achieved.

In integrated structures using PN junction isolation techniques to isolate active and passive devices, it is necessary to apply a negative potential to a P type isolating region or a positive potential to an N type isolating region to create the essential reverse bias condition for isolation. It is, therefore, important to provide a connector that is electrically isolated from the isolating region of the integrated structure in such a manner so as to permit the connector voltage to be at a potential value that can be either below or above the potentials applied to the isolation region.

Furthermore, the connector should occupy as small a planar area as possible thereby reducing the amount of semiconductor area required therefor and this will also result in a reduction in capacitance thereby increasing the figure of merit.

In the formation of underpass connectors, it is essential to prevent possible shorting of the connector region to a region of the same type conductivity as the connector. Accordingly, the use of a connector formed by either a base or emitter diffusion or a combination of both diffusions in an epitaxial region does not provide a good connector because the resistivity value is usually above what is needed to provide optimum conducting properties and furthermore, since the connector region is formed by a diffusion operation this could result in "pipes" being formed which could create shorting to a region of the same conductivity type as the connector. "Pipes" is a term of the art referring to channels of diffused material formed usually in fault areas of a semiconductor structure which reach undesired regions in the structure.

Accordingly, it is an object of this invention to provide an improved semiconductor underpass connecter.

It is a further object of this invention to provide an extremely low resistivity semiconductor underpass connector.

It is a still further object of this invention to provide an isolated semiconductor underpass connector in an integrated semiconductor structure having an isolating region about each device wherein the connector region can be tied to a potential source either above or below the potential applied to the isolating region.

It is another object of this invention to provide a connector which has a high figure of merit and a resistance value that is approximately 2 ohms per square which is on the order of approximately six times smaller than the sheet resistance value achieved by an emitter type diffusion operation used in forming an active device or passive device.

It is a further object of this invention to reduce or eliminate pipes in a semiconductor underpass connector and also to prevent inversion of the surface portion of the connector.

It is a still further object of this invention to produce a semiconductor underpass connector during the first two diffusion operations in the formation of an integrated semiconductor structure using PN junction isolation to isolate each of the devices.

It is still another object of this invention to provide an improved semiconductor underpass connector fabricated by diffusion operations independent of the fabrication of active or passive devices in an integrated semiconductor structure.

In accordance with a particular form of the invention the semiconductor underpass connector comprises a composite semiconductor structure having a substrate region of one type conductivity. A buried low resistivity region of opposite type conductivity is located in a surface portion of the substrate region. A central region of the same type conductivity as the substrate region and having a low resistivity portion extends from a portion of the surface of the composite semiconductor structure into contact with the buried low resistivity region of opposite type conductivity. A first isolation region of the same conductivity type as the budied low resistivity region surrounds the central region. The first isolation region is in contact with the buried low resistivity region and the low resistivity portion of the central region extends downwardly from the entire surface portion of the composite semiconductor structure defined by the inner limit of the first isolation region. A second isolation region having the same conductivity type as the substrate region is in contact with the substrate region and surrounds the first isolation region of opposite type conductivity. A pair of spaced metal contacts electrically connected to the low resistivity portion of the central region permit a low resistance underpass connection to be made using the low resistivity portion as a conductive path.

Also in accordance with a particular form of the invention, the method for fabricating a low resistivity, semiconductor, underpass connector for an integrated semiconductor structure having active and passive elements therein comprises the step of forming an isolated region of one type conductivity independently of regions formed in fabricating the active and passive semiconductor devices in the integrated semiconductor structure. The formed isolated region extends from a surface of the integrated semiconductor structure to a buried low resistivity region of the opposite type conductivity. The formed isolated region has a low resistivity portion extending inwardly from the surface thereof. A pair of spaced metal contacts are applied to the surface of the formed isolated region in electrical contact with the low resistivity portion to provide a low resistance continuous current path through the low resistivity semiconductor portion.

The foregoing and other objects, features and advantages of the invention will be apparent from the following more particular description of a preferred embodiment of the invention as illustrated in the accompanying drawings.

Figure 1C:
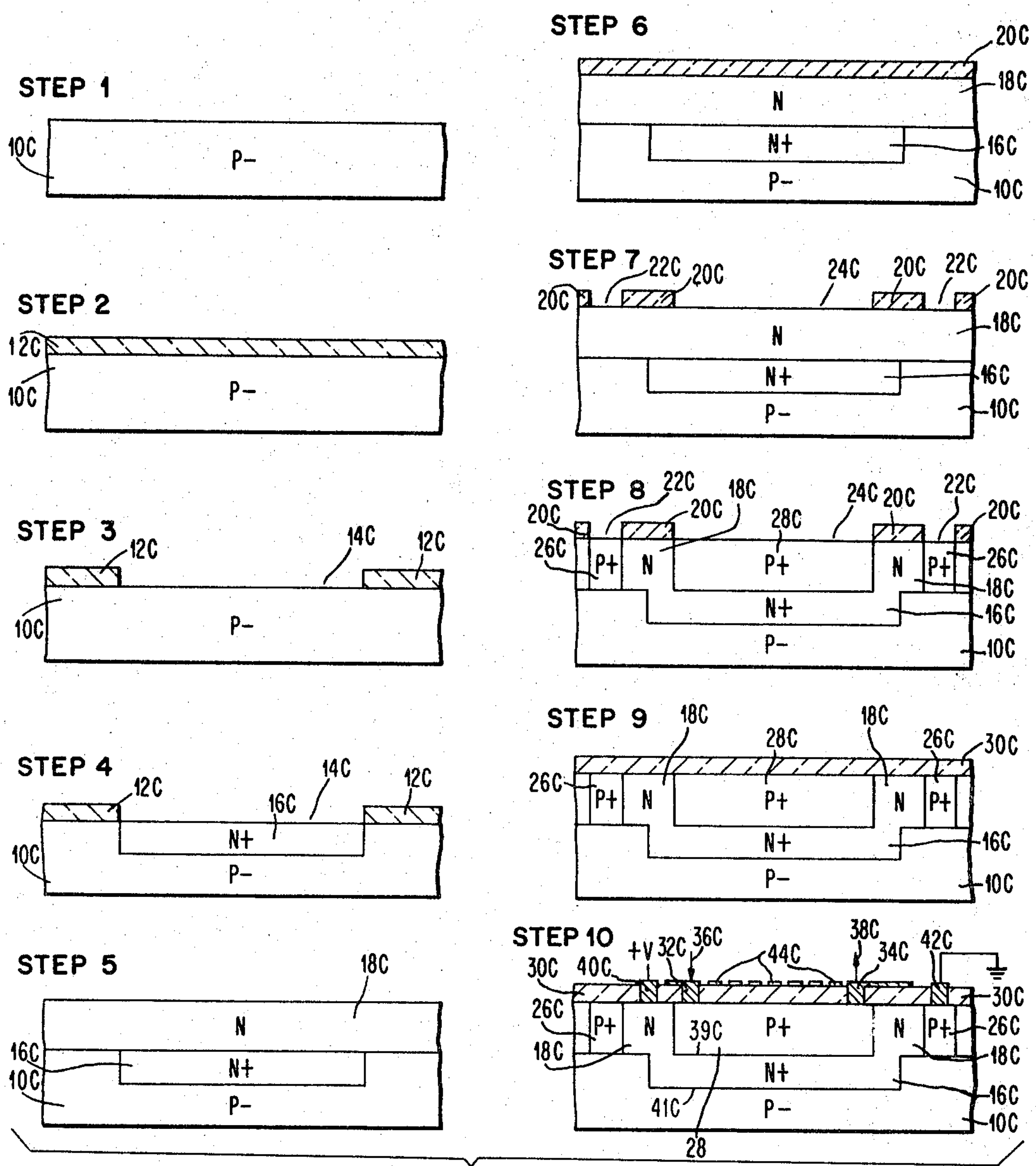
FIG. 1C is a flow diagram showing the steps in cross-section of the fabrication process of this invention.

In discussing the semiconductor device of this invention, the usual terminology that is well known in the transistor field will be used. In discussing concentrations, references will be made to majority or minority carriers. By "carriers" is signified the free-holes or electrons which are responsible for the passage of current through a semiconductor material. Majority carriers are used in reference to those carriers in the material under discussion, i.e. holes in P type material or electrons in N type material. By use of the terminology "minority carriers" it is intended to signify those carriers in the minority, i.e. holes in N type material or electrons in P type material. In the most common type of semiconductor materials used in present day transistor structure, carrier concentration is generally due to the concentration of the "significant impurity," that is, impurities which impart conductivity characteristics to extrinsic semiconductor materials.

Although for the purpose of describing this invention reference is made to a semiconductor configuration wherein a $P^-$ type region is utilized as the substrate and subsequent semiconductor regions of the composite semiconductor structure are formed in the conductivity types shown in the drawings, it is readily apparent that the same regions shown in the drawings can be of opposite type conductivities and furthermore, some of the operations which are described as diffusion operations can be made by epitaxial growth and some of the epitaxial growth regions can also be fabricated by diffusion techniques.

The semiconductor underpass connector of this invention is particularly useful in the monolithic integrated structure described in the patent application entitled "Monolithic Integrated Structure Including Fabrication and Package Therefor" assigned to the same assignee of this invention and filed concurrently herewith.

Referring to FIG. 1C, step 1 depicts a substrate 10C of $P^-$ type conductivity, preferably having a resistivity of 10 to 20 ohms-centimeter. The substrate 10C is preferably a monocrystalline silicon structure which can be fabricated by conventional techniques such as by pulling a silicon semiconductor member from a melt containing the desired impurity concentration and then slicing the pulled member into a plurality of wafers. The substrate 10C is a portion of one such wafer.

Referring to step 2, an oxide coating 12C preferably of silicon dioxide and having a thickness of 5200 Angstrom units is either thermally grown by conventional heating in a wet atmosphere at 1050° C. for 60 minutes or by pyrolytic deposition of an oxide layer on the surface of the substrate 10C. Alternatively, an RF sputtering technique, as described in a patent application identified as Ser. No. 428,733, filed Jan. 28, 1965 in the names of Davidse and Maissel and assigned to the same assignee as this invention, can be used to form the silicon dioxide layer 12C.

In step 3, by standard photolithographic masking and etching techniques a photoresist layer (not shown) is deposited onto the substrate including the surface of the oxide layer 12C and by using the photoresist layer as a mask a surface region 14C is exposed on the surface of the substrate 10C by etching away the desired portion of the $SiO_2$ layer 12C with a buffered HF solution. The photoresist layer is then removed to permit further processing.

In step 4, a diffusion operation is carried out to diffuse into the surface 14C of the substrate 10C an $N^+$ type region 16C having a $C_0$ of $2\times10^{20}$ cm.$^{-3}$ of N type majority carriers. The oxide layer 12C serves as a mask to prevent the $N^+$ region 16C from being formed across the entire surface of the substrate 10C. Preferably, the diffusion operation is carried out in an evacuated quartz capsule using degenerate arsenic doped silicon powder. As an alternative variation, the $N^+$ region 16C can be formed by etching out a channel in the $P^-$ type substrate 10C and then subsequently epitaxially growing an $N^+$ region.

In step 5 after removing the oxide layer 12C with a buffered HF solution, a region 18C of N type conductivity, preferably having a resistivity of 0.2 ohm per centimeter, is epitaxially grown on the surface of the substrate. The epitaxial region 18C is an arsenic doped layer approximately 5.5 to 6.5 microns thick. In actual device fabrication, the arsenic impurities in the region 16C, which is now buried, outdiffuses about one micron during the epitaxial deposition.

In step 6, an oxide layer 20C approximately 5200 Angstrom units thick is formed on the surface of the epitaxially grown region 18C either by the thermal oxidation process, by pyrolytic deposition, or by RF sputtering techniques.

In step 7, an opening 22C and a central opening 24C are formed in the oxide layer by standard photolithographic masking and etching techniques using a photoresist layer as a mask and a buffered HF solution to remove the desired oxide portions. The structure is now prepared for the subsequent diffusion operation.

In step 8, a $P^+$ diffusion is carried out, preferably using a boron source, to form surrounding region 26C and central region 28C in the N type epitaxially grown region 18C. This diffusion operation is carried out at a temperature of 1200° C. for a period of 95 minutes forming a $C_0$ (surface concentration) of $5\times10^{20}$cm.$^{-3}$. It is evident from the drawing that the $P^+$ region 28C extends continuously from the surface of the semiconductor structure to the $N^+$ buried low resistivity region 16C. The $N^+$ buried region acts as a barrier region which prevents the $P^+$ region going through to the substrate region 10C. Furthermore, it is evident that the $P^+$ diffused region 28C will have a low resistivity surface region which extends downwardly from the surface of the semiconductor structure and across to the inner limit of the N type region 18C. It is this optimum high conductivity or low resistivity region that permits the subsequent formation of a low resistivity underpass connector in the semiconductor region 28C. Now, other devices can be fabricated.

In step 9, an oxide layer 30C preferably having a thickness of about 4300 Angstrom units is thermally grown, in a 5 minute dry $O_2$ followed by a 15 minute steam cycle and then followed by a 5 minute dry $O_2$ treatment. This step is necessary to permit the subsequent formation of contacts to the various conductivity regions of the semiconductor structure.

In step 10, by using photolithographic masking and etching techniques described above, a pair of holes are opened up in the oxide layer 30C above the $P^+$ central region 28C to permit the formation of metal ohmic contacts 32C and 34C. The ohmic contacts 32C and 34C are preferably formed by evaporating a layer of aluminum and then subtractively removing undesired portions to leave the desired metal land pattern on the surface of the oxide layer 30C. Arrows 36C and 38C respectively show the current flow through contact 32C across the low resistivity portion of the semiconductor region 28C and up through the contact 34C. A further ohmic contact 40C is made, through an opening formed in the oxide layer 30C, to the N type region 18C which surrounds the central $P^+$ region 28C. This contact 40C permits the application of a positive voltage to the N type region 18C which acts as a reverse bias to the PN junctions 39C and 41C defined by the N,$N^+$ regions 18C, 16C and the $P^+$ regions 28C and 26C and $P^-$ region 10C. The $P^+$ region 26C, which surrounds the N type region 18C, merges into the substrate region 10C so that an ohmic contact 42C to the region 26C permits the entire P type region (includes regions 26C and 10C) to be placed at a reverse bias potential, such as ground. PN junction 41C separates P type regions 26C and 10C from N type regions 18C and 16C. PN junction 39C separates $P^+$ region 28C from N type regions 18C and 16C.

In this manner a low resistivity semiconductor underpass structure is provided which permits a plurality of insulating conductors or lands 44C formed on the oxide layer 30C to pass between the contacts 32C and 34C of the underpass connector. The conductors 44C are connected up to other areas or devices of the integrated structure of which the underpass connector of this invention is a part thereof. Hence, the conductors 44C are substantially perpendicular to the lands connected to ohmic contacts 32C and 34C. The central $P^+$ region 28C is isolated by N type regions 18C and 16C and hence can receive a positive potential as long as it is not higher than the positive potential applied to the N type regions 18C and 16C. If the semiconductor regions of the underpass connector shown in the drawings were of opposite type conductivity, then the signs of the potentials applied to the semiconductor regions would also be reversed.

Figure 2C:
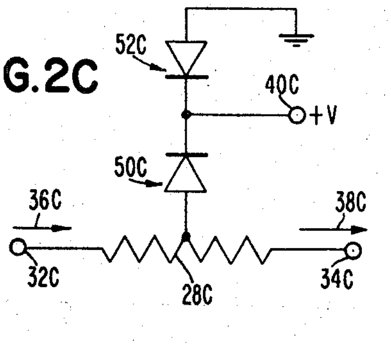
FIG. 2C is a schematic view of the circuit represented by the connector of FIG. 1C.

Referring to FIG. 2C, a schematic view is shown of the isolated semiconductor underpass connector of step 10 of FIG. 1C. Arrows 36C and 38C of FIG. 2C correspond to arrows 36C and 38C shown in FIG. 1C. Consequently, the current input is applied to the ohmic contact 32C and the output is taken out from the ohmic contact 34C with the annular region 28C shown in FIG. 2C as a resistor of very low value. Ohmic contact 40C connected to the N type region 18C is shown in FIG. 2C as being at a positive potential and electrically connected between two diodes 50C and 52C. Diode 50C is the diode configuration formed by the $P^+$ type region 28C and the N type regions 18C and 16C. Diode 52C is formed by the N type regions 18C and 16C and the P type regions 26C and 10C. As shown in this figure, the P type region which includes the substrate region 10C and the $P^+$ region 26C is connected to a reverse bias potential, such as ground.

Figure 3C:
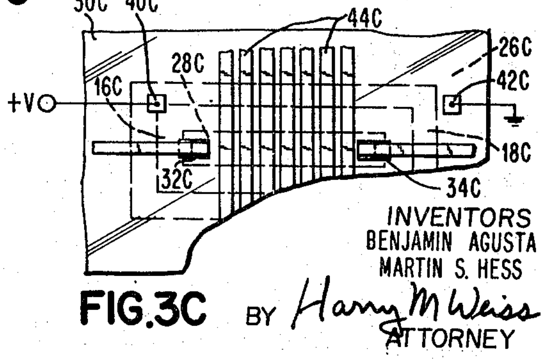
FIG. 3C is a partial top view showing the various semiconductor regions by phantom lines.

FIG. 3C shows a top view of the underpass connector of step 10 of FIG. 1C with the broken or phantom lines identifying each of the semiconductor regions making up the underpass connector. As seen from this figure, the $N^+$ buried region 16C has a greater width and length than the width and length of the contacting $P^+$ region 28C. Furthermore, the $P^+$ region 28C is rectangular having a substantially longer length than its width so as to permit as many conductors 44C to cross over the underpass region between contacts 32C and 34C. If desired, a base type diffusion can be added in the vicinity of the diffused regions surrounding contacts 32C and 34C to increase the area for making contact to the region 28C. This would provide a substantially dumbbell-shaped configuration instead of the rectangular configuration shown in FIG. 3C.

In a specific example of the low resistivity, semiconductor, underpass connector described above, the $P^-$ substrate region 10C had a depth of approximately 8 mils;

the epitaxially grown region had a depth of approximately 5 microns, and consequently, the $P^+$ regions 26C and 28C also had a depth of approximately 5 microns. The depth of the $N^+$ buried region 16C was approximately 2 microns. The width of the $P^+$ region 28C was approximately 0.3 mil and the length in some applications was 1 mil and in other applications was as large as 10 mils. The width of the N region 18C between the $P^+$ region 28C and the $P^+$ region 26C was approximately 0.7 mil. The width of the $P^+$ region 26C was approximately 2 mils and the width of the $P^+$ region 28C was approximately 0.3 mil. The $P^+$ region 28C is usually the $P^+$ isolation region formed about active or passive devices in the integrated semiconductor structure. The $N^+$ region 16C prevents pipes from the diffused $P^+$ region 28C to reach the $P^-$ substrate region 10C.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A low resistivity, semiconductor, underpass connector comprising, in combination:

a composite semiconductor structure having a substrate region of one type conductivity and a layer of semiconductor material on said substrate;

a buried low resistivity region of opposite type conductivity located in a surface portion of said substrate region;

a central region of the same type conductivity as said substrate region having a low resistivity portion and extending from a portion of the surface of said layer of semiconductor material into contact with said buried low resistivity region of opposite type conductivity;

a first isolation region of the same conductivity type as said buried low resistivity region surrounding said central region, said first isolation region being in contact with said buried low resistivity region, said low resistivity portion of the central region extending downwardly from the entire surface portion of said layer of semiconductor material defined by the inner limit of said first isolation region;

a second isolation region having the same conductivity type as said substrate region in contact with said substrate region and surrounding said first isolation region of opposite type conductivity;

a pair of spaced metal contacts electrically connected to said low resistivity portion of said central region thereby permitting a low resistance underpass connection to be made using said low resistivity portion as a conductive path; and at least one conductive connector, electrically isolated from said low resistivity portion conductive path and disposed in a direction crossing over said conductive path.

2. A low resistivity, semiconductor, underpass connector in accordance with claim 1, wherein said central region having a rectangular configuration with one dimension substantially longer than the other dimension, said second isolation region having a lower resistivity than said first isolation region, the resistivity of said second isolation region being substantially equal to the resistivity of said central region.

3. A low resistivity, semiconductor, underpass connector in accordance with claim 2, wherein said buried low resistivity region having a greater width and length than the width and length of said central region, said first isolation region and said buried low resistivity region completely isolating said central region from said second isolation region and said substrate region.

4. A low resistivity, semiconductor, underpass connector in accordance with claim 3, in which said substrate region is of $P^-$ type conductivity, said buried low resistivity region being of $N^+$ type conductivity, said central region being of substantially $P^+$ type conductivity, said first isolation region being of N type conductivity, and said second isolation region being of substantially $P^+$ type conductivity.

5. In an integrated semiconductor structure having active and passive components, a low resistivity, semiconductor, underpass connector comprising:

a composite semiconductor structure having a substrate region of one type conductivity and a layer of semiconductor material on said substrate;

a buried low resistivity region of opposite type conductivity located in a surface portion of said substrate region;

a central region of the same type conductivity as said substrate region having a low resistivity portion and extending from a portion of the surface of said layer of semiconductor material into contact with said buried low resistivity region of opposite type conductivity;

a first isolation region of the same conductivity type as said buried low resistivity region surrounding said central region, said first isolation region being in contact with said buried low resistivity region, said low resistivity portion of the central region extending downwardly from the entire surface portion of said layer of semiconductor material defined by the inner limit of said first isolation region;

a second isolation region having the same conductivity type as said substrate region in contact with said substrate region and surrounding said first isolation region of opposite type conductivity;

a pair of spaced metal contacts electrically connected to said low resistivity portion of said central region thereby permitting a low resistance underpass connection to be made using said low resistivity portion as a conductive path, said first isolation region and said buried low resistivity region being at a potential sufficient to reverse bias the PN junctions formed by both said central region and said second isolation region with said substrate region;

metal contacts electrically connected to said first and second isolation regions; and at least one conductive connector, electrically isolated from said low resistivity portion conductive path and disposed in a direction crossing over said conductive path.

6. In an integrated semiconductor structure having active and passive components, a low resistivity, semiconductor, underpass connector in accordance with claim 5 wherein said at least one conductive connector is a plurality of metal lands electrically isolated from said low resistivity portion by an insulating layer on the surface of the composite semiconductor structure between the pair of spaced metal contacts, said lands being located on said insulating layer.

7. In an integrated semiconductor structure having active and passive components, a low resistivity, semiconductor, underpass connector in accordance with claim 5, wherein said central region having a rectangular configuration with one dimension substantially longer than the other dimension, said second isolation region having a lower resistivity than said first isolation region, the resistivity of said second isolation region being substantially equal to the resistivity of said central region, said buried low resistivity region having a greater width and length than the width and length of said central region, said first isolation region and said buried low resistivity region completely isolating said central region from said second isolation region and said substrate region.

8. In an integrated semiconductor structure having active and passive components, a low resistivity, semiconductor, underpass connector in accordance with claim 7, in which said substrate region is of $P^-$ type conductivity, said buried low resistivity region being of $N^+$ type conductivity, said central region being of substantially $P^+$ type conductivity, said first isolation region being of N type conductivity, and said second isolation region being of substantially $P^+$ type conductivity.

References Cited

UNITED STATES PATENTS

| | | | |
|---|---|---|---|
| 3,265,905 | 8/1966 | McNeil | 317—235 |
| 3,283,170 | 11/1966 | Buie | 317—235 |
| 3,295,031 | 12/1966 | Schmitz | 317—235 |
| 3,312,882 | 4/1967 | Pollock | 317—235 |

JOHN W. HUCKERT, *Primary Examiner.*

JERRY D. CRAIG, *Assistant Examiner.*

U.S. Cl. X.R.

148—175; 317—235